(12) United States Patent
Gan

(10) Patent No.: US 10,861,883 B2
(45) Date of Patent: Dec. 8, 2020

(54) METHOD OF PREPARING IGZO THIN FILM TRANSISTOR

(71) Applicant: SHENZHEN CHINA STAR OPTOELECTRONICS SEMICONDUCTOR DISPLAY TECHNOLOGY CO., LTD., Guangdong (CN)

(72) Inventor: Qiming Gan, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 494 days.

(21) Appl. No.: 15/749,492

(22) PCT Filed: Jan. 4, 2018

(86) PCT No.: PCT/CN2018/071379
§ 371 (c)(1),
(2) Date: Feb. 1, 2018

(87) PCT Pub. No.: WO2019/127634
PCT Pub. Date: Jul. 4, 2019

(65) Prior Publication Data
US 2020/0295058 A1 Sep. 17, 2020

(30) Foreign Application Priority Data
Dec. 27, 2017 (CN) .......................... 2017 1 1444804

(51) Int. Cl.
*H01L 27/12* (2006.01)
*H01L 29/66* (2006.01)
*H01L 29/786* (2006.01)

(52) U.S. Cl.
CPC ...... *H01L 27/1288* (2013.01); *H01L 27/1225* (2013.01); *H01L 29/66969* (2013.01); *H01L 29/7869* (2013.01)

(58) Field of Classification Search
CPC ............. H01L 27/1288; H01L 27/1225; H01L 29/66969; H01L 29/7869
(Continued)

(56) References Cited

U.S. PATENT DOCUMENTS

2008/0258140 A1* 10/2008 Lee ..................... H01L 29/7869
257/43
2008/0258141 A1* 10/2008 Park .................. H01L 29/78621
257/43
(Continued)

FOREIGN PATENT DOCUMENTS

CN 102956676 A * 3/2013
CN 103715272 A 4/2014
CN 105140131 A 12/2015

*Primary Examiner* — Sheikh Maruf
(74) *Attorney, Agent, or Firm* — Hemisphere Law, PLLC; Zhigang Ma

(57) ABSTRACT

A method of preparing IGZO thin film transistor is provided. The method includes. step S1, using a first mask on a first metal layer to form a grid electrode, and sequentially forming grid insulating layer, IGZO semiconducting layer and second metal layer on grid electrode; step S2, coating photoresist layer on second metal layer, and exposure developing photoresist layer by second mask, and simultaneously etching second metal layer and IGZO semiconducting layer by hydrogen peroxide, and second metal layer is formed to source electrode and drain electrode by etching; step S3, forming passivation layer on source electrode and drain electrode, and forming a via hole above drain electrode by third mask; step S4, forming pixel electrode on passivation layer by fourth mask, and pixel electrode is connecting to drain electrode by via hole.

8 Claims, 5 Drawing Sheets

(58) Field of Classification Search
USPC .......................................................... 438/22
See application file for complete search history.

(56) References Cited

U.S. PATENT DOCUMENTS

| | | | | | |
|---|---|---|---|---|---|
| 2008/0258143 | A1* | 10/2008 | Kim | ..................... | H01L 29/458 257/43 |
| 2008/0296568 | A1* | 12/2008 | Ryu | .................... | H01L 29/7869 257/43 |
| 2010/0301328 | A1* | 12/2010 | Yamazaki | ........... | H01L 29/4908 257/43 |
| 2010/0308324 | A1* | 12/2010 | Kim | .................... | H01L 27/1225 257/43 |
| 2011/0032444 | A1* | 2/2011 | Yamazaki | ............. | H01L 27/127 349/42 |
| 2011/0086474 | A1* | 4/2011 | Chin | .................. | H01L 27/1214 438/155 |
| 2012/0007086 | A1* | 1/2012 | Oh | ..................... | H01L 51/0508 257/59 |
| 2012/0045904 | A1* | 2/2012 | Choi | .................. | H01L 29/4908 438/786 |
| 2012/0146029 | A1* | 6/2012 | Choi | .................. | H01L 27/1225 257/59 |
| 2012/0146085 | A1* | 6/2012 | Park | .................... | G02F 1/13458 257/99 |
| 2012/0188478 | A1* | 7/2012 | Kuwabara | ......... | G02F 1/136286 349/43 |
| 2013/0119385 | A1* | 5/2013 | Kao | .................... | H01L 27/1288 257/57 |
| 2013/0119386 | A1* | 5/2013 | Huang | ................ | H01L 27/1255 257/59 |
| 2013/0215370 | A1* | 8/2013 | Takanishi | ............ | H01L 27/1288 349/139 |
| 2014/0014979 | A1* | 1/2014 | Matsumoto | ......... | H01L 33/0041 257/88 |
| 2014/0054586 | A1* | 2/2014 | Yao | .................. | H01L 29/66969 257/43 |
| 2014/0159059 | A1* | 6/2014 | Jeong | ................... | H01L 27/124 257/79 |
| 2015/0076486 | A1* | 3/2015 | Hu | ...................... | H01L 27/1225 257/43 |
| 2015/0102317 | A1* | 4/2015 | Kim | .................. | H01L 29/78606 257/40 |
| 2015/0221675 | A1* | 8/2015 | Yasukawa | ............ | G02F 1/1368 438/22 |
| 2016/0172562 | A1* | 6/2016 | Voutsas | ............... | H01L 27/1288 438/22 |
| 2016/0358944 | A1* | 12/2016 | Yin | ....................... | H01L 27/127 |

* cited by examiner

METHOD OF PREPARING IGZO THIN FILM TRANSISTOR

RELATED APPLICATIONS

The present application is a National Phase of International Application Number PCT/CN2018/071379, filed Jan. 4, 2018, and claims the priority of China Application No. 201711444804.0, filed Dec. 27, 2017.

FIELD OF THE DISCLOSURE

The disclosure relates to a panel display technical field, and more particularly to a method of preparing IGZO thin film transistor.

BACKGROUND

With the display technology development, the liquid crystal display panel is gradually developing to large size and high resolution. It also means the charging time of the pixel is more and more short, and the most key factor of the pixel charging is TFT. The property of TFT is decided by active layer. In the traditional TFT is using the AS (a-Si) to be active layer. AS element is already developing for long, and the property is stable, but mobility of the AS is low, it will gradually lose the advantage at high resolution and high refresh rate. In another oxide semiconductor material—IGZO (Indium Gallium Zinc Oxide) is more popular. IGZO has a better mobility than the AS such that has a faster charging speed, and it could make a smaller TFT, enhances pixel resolution, decreases backlight consumption. In another hand, IGZO has a smaller leakage current, it also good for power consumption of the LCD panel.

At the beginning of development the IGZO is refer to the AS 5 mask manufacturing the TFT. But, development trend of the display field is always high quality and low cost, and it needs to simplify manufacturing method and enhances manufacturing time.

SUMMARY

A technical problem to be solved by the disclosure is to provide a method of preparing IGZO thin film transistor with simplify the method and decreasing preparing time.

An objective of the disclosure is achieved by following embodiments. In particular, a method of preparing IGZO thin film transistor, comprising step S1, using the first mask on the first metal layer to form a grid electrode, and sequentially forming a grid insulating layer, a IGZO semiconducting layer and a second metal layer on the grid electrode;

step S2, coating a photoresist layer on the second metal layer, and exposure developing the photoresist layer by the second mask, and simultaneously etching the second metal layer and the IGZO semiconducting layer by hydrogen peroxide, and the second metal layer is forming a source electrode and a drain electrode by etching;

step S3, forming a passivation layer on the source electrode and the drain electrode, and forming a via hole above the drain electrode by a third mask;

step S4, forming a pixel electrode on the passivation layer by a fourth mask, and the pixel electrode is connecting to the drain electrode by the via hole.

In an embodiment, in the step S2, selection ratio of etching speed of the second metal layer and etching speed of the IGZO semiconducting layer is greater than 20.

In an embodiment, in the step S2 specifically comprising coating the photoresist layer on the second metal layer;

exposure developing the photoresist layer by the second mask, removing the photoresist layer projected on the grid electrode and forming a first channel region;

using hydrogen peroxides to simultaneously etch the second metal layer and the IGZO semiconducting layer are located beside the grid electrode;

removing all of the photoresist on the first channel region and forming a second channel region;

etching the second metal layer in the second channel region, and respectively forming the drain electrode and the source electrode. In an embodiment, the second mask is half tone mask.

In an embodiment, the photoresist of the first channel region is specifically removed by ashing which performed with oxygen plasma.

In an embodiment, while etching the second metal layer in the second channel region, the etching process until without covering the IGZO semiconducting layer positioned under the second metal layer.

In an embodiment, in the step S3, the passivation layer is formed by depositing the drain electrode, the source electrode and the IGZO semiconducting layer which not covered by the drain electrode and the source electrode.

In an embodiment, in the step S4 specifically comprising
forming the pixel electrode layer on the passivation layer
exposure developing the pixel electrode layer by the fourth mask, and forming the pixel electrode;
connecting the pixel electrode and the drain electrode by the via hole.

In an embodiment, the pixel electrode layer is ITO layer.

In an embodiment, the IGZO semiconducting layer is forming by physical vapor deposition.

The $H_2O_2$ of this disclosure is used to etching the second metal layer and also etching the IGZO semiconducting layer in this disclosure. The selection ratio of etching speed of the second metal layer and etching speed of the IGZO semiconducting layer is greater than 20 such that the second metal layer and the IGZO semiconducting layer could process the wet etching at the same time. Comparing to the existing technology which needs to respectively process for wet etching, this invention could short the manufacturing time and enhances products yield.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
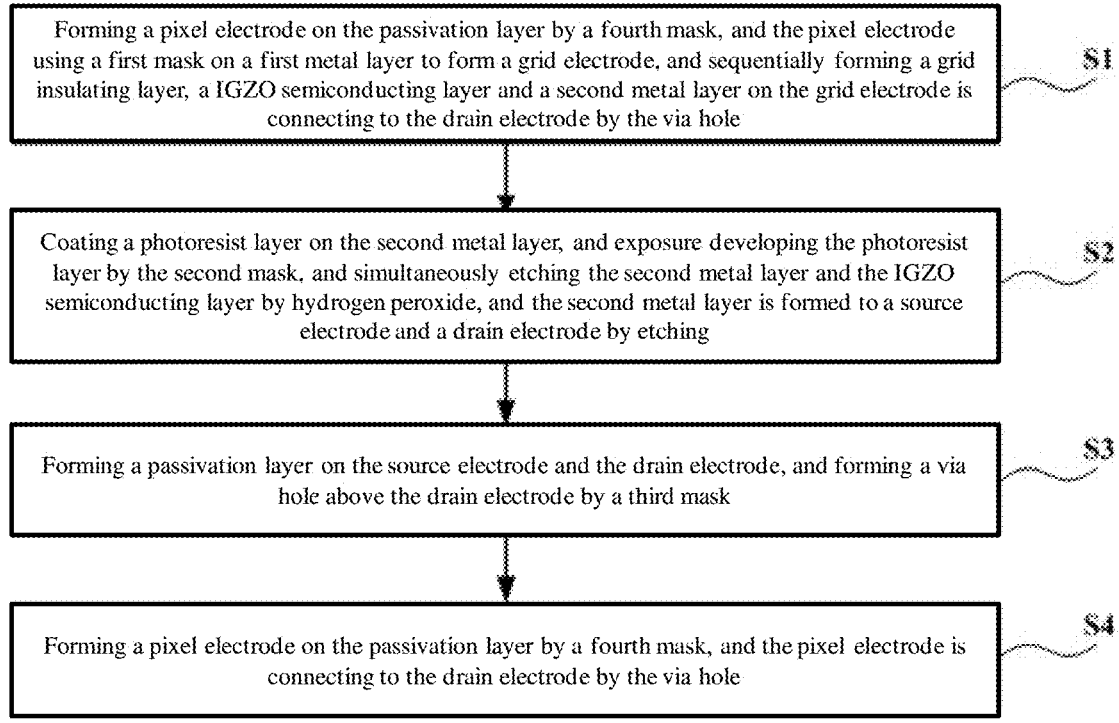
FIG. 1 is a flow chart diagram of a method of preparing IGZO thin film transistor according to an embodiment of the disclosure.
Figure 2:
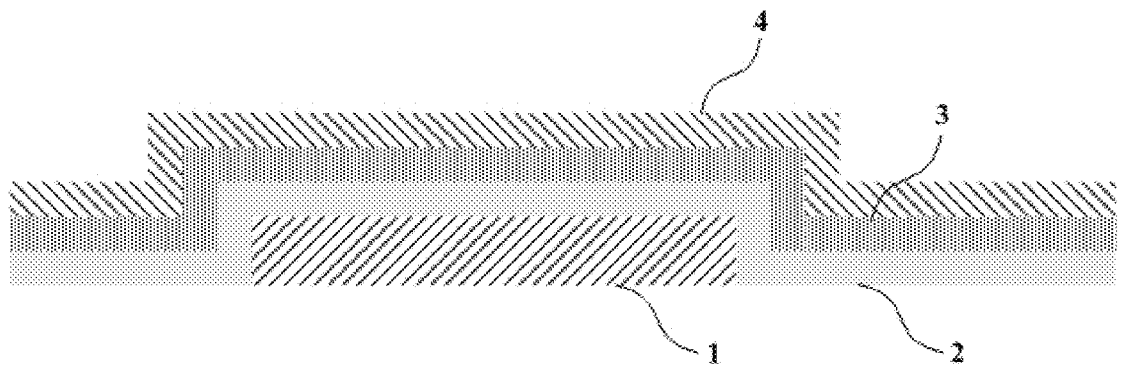
FIG. 2 is a schematic diagram of a grid insulating layer, a IGZO semiconducting layer and a second metal layer are sequentially formed on the grid electrode according to an embodiment of the disclosure.

Please refer to FIG. 1. An method of preparing IGZO thin film transistor is provided by this disclosure, the method comprises following steps.

Using the first mask on the first metal layer to form a grid electrode, and sequentially forming a grid insulating layer, a IGZO semiconducting layer and a second metal layer on the grid electrode;

Coating a photoresist layer on the second metal layer, and exposure developing the photoresist layer by the second mask, and simultaneously etching the second metal layer and the IGZO semiconducting layer by hydrogen peroxide, and the second metal layer is formed to a source electrode and a drain electrode by etching;

Forming a passivation layer on the source electrode and the drain electrode, and forming a via hole above the drain electrode by a third mask Forming a pixel electrode layer on the passivation layer, and exposure developing the pixel electrode layer by a fourth mask for forming a pixel electrode, and the pixel electrode is connecting to the drain electrode by the via hole.

Specifically, please refer to FIG. 2 to FIG. 11, which are respectively showing steps of method of preparing IGZO thin film transistor according to this embodiment. Firstly, forming a first metal layer (not shown) on the substrate (not shown). And shown as FIG. 2, forming the grid electrode 1 of the first metal layer by the first mask, and then sequentially forming the grid insulating layer 2, the IGZO semiconducting layer 3 and the second metal layer 4 on the grid electrode 1. The grid insulating layer 2 could be any one of the silicon dioxide layer, nitrided silicon layer or silicon oxynitride. The IGZO semiconducting layer 3 is forming by physical vapor deposition.

Figure 3:
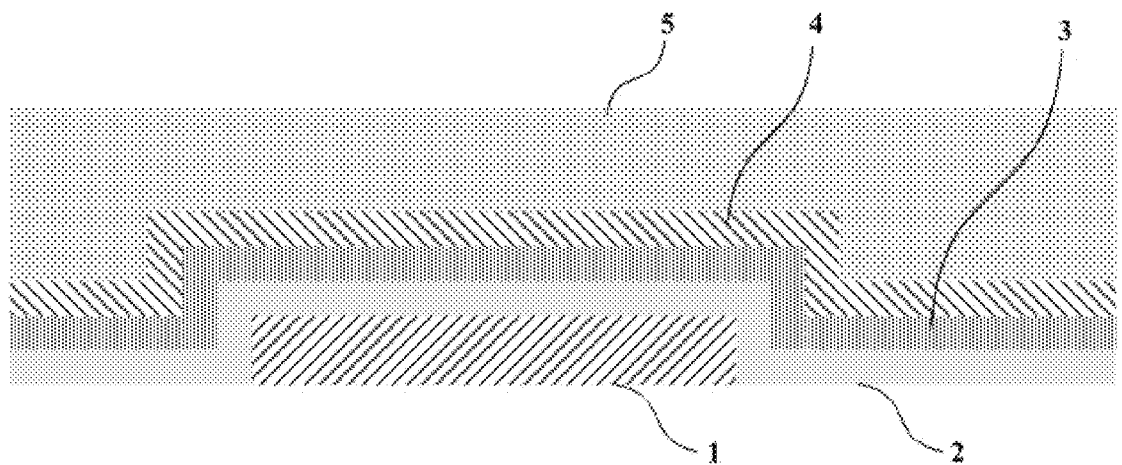
FIG. 3 is a schematic diagram of coating a photoresist layer on the second metal layer according to an embodiment of the disclosure.
Figure 4:
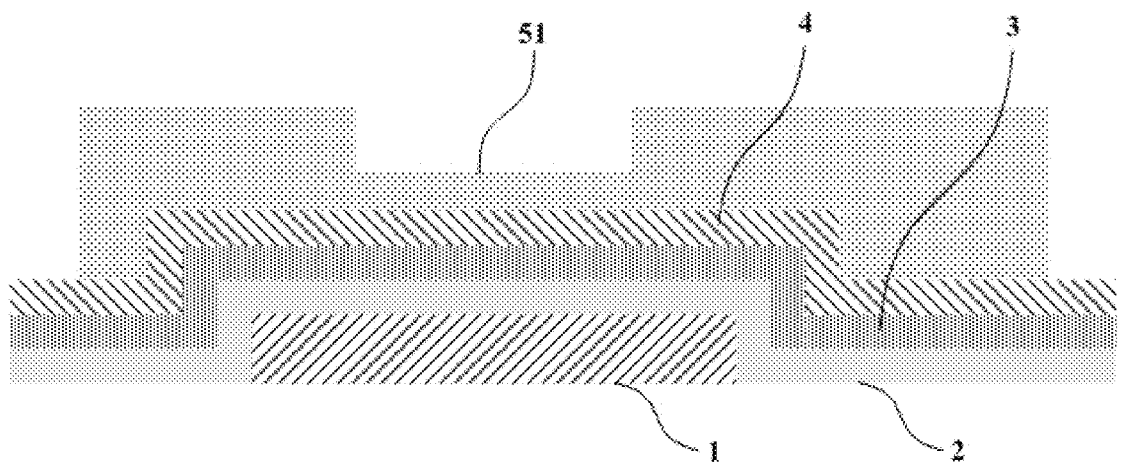
FIG. 4 is a schematic diagram of exposure developing the photoresist layer shown in FIG. 3 by the second mask according to an embodiment of the disclosure.

Please refer to FIG. 3, coating the photoresist layer 5 on the second metal layer 4. And shown as FIG. 4, exposure developing the photoresist layer 5 by the second mask, removing partial of the photoresist which projected on the grid electrode 1 and forming a first channel region 51. Wherein, the second mask is half tone mask (HTM).

Figure 5:
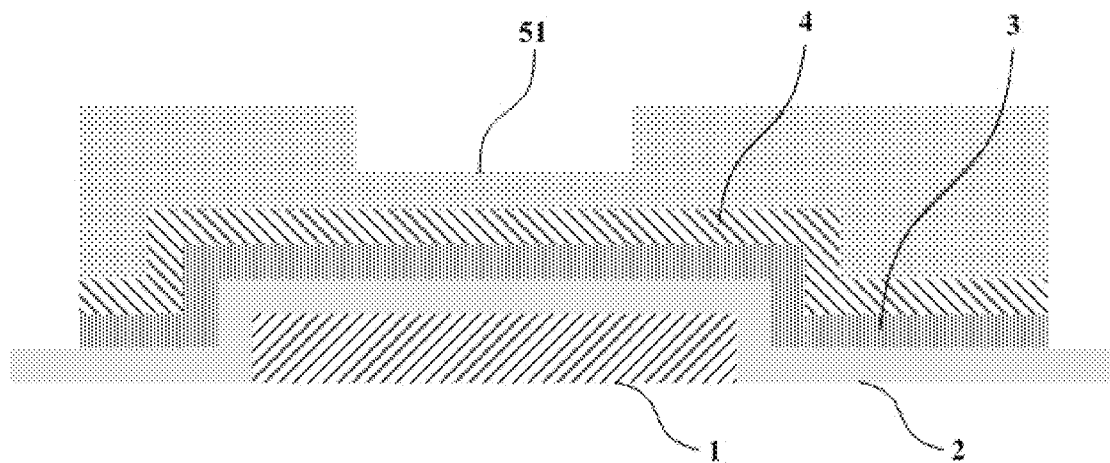
FIG. 5 is a schematic diagram of simultaneously etching the second metal layer and the IGZO semiconducting layer according to an embodiment of the disclosure.
Figure 6:
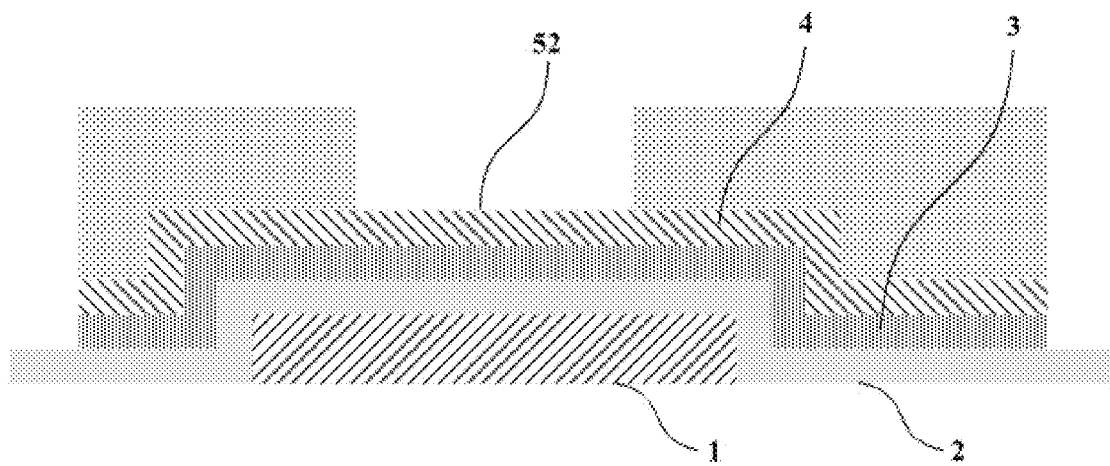
FIG. 6 is a schematic diagram of removing the photoresist layer according to an embodiment of the disclosure.

Please refer to FIG. 5, simultaneously etching the second metal layer 4 and the IGZO semiconducting layer 3 which are positioned beside the grid electrode 1 by hydrogen peroxide ($H_2O_2$), selection ratio of etching speed of the second metal layer 4 and etching speed of the IGZO semiconducting layer 3 is greater than 20. Please refer to FIG. 6, removing the photoresist of the first channel region 51 and forming a second channel region 52. Specifically, the photoresist of the first channel region 51 is removed by ashing which performed with oxygen plasma of dry photo etching technology.

Figure 7:
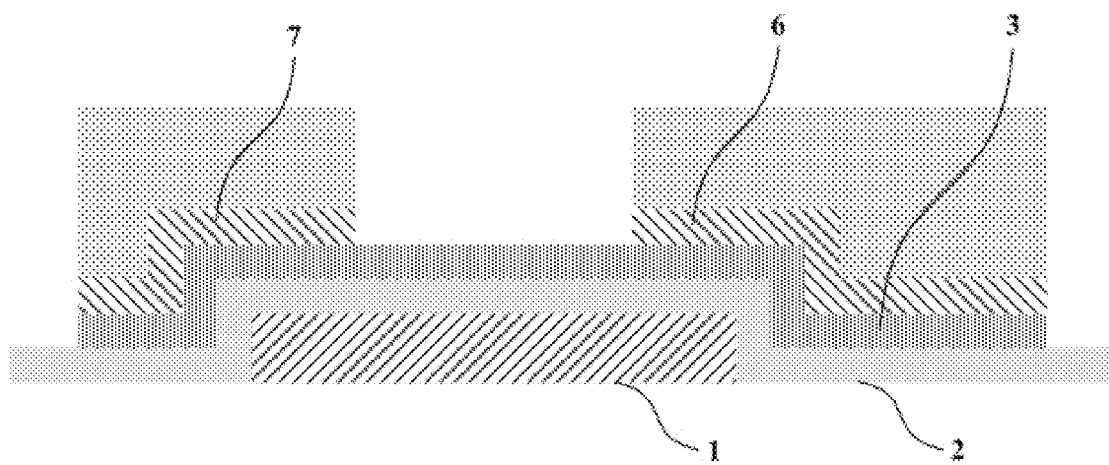
FIG. 7 is a schematic diagram of etching the second metal layer on the channel region according to an embodiment of the disclosure.

And please refer to FIG. 7, etching the second metal layer 4 already removed the phototresist in the second channel region 52, and respectively forming the drain electrode 6 and the source electrode 7. It is noted that, while etching the second metal layer in the second channel, the etching process will keep etch until the second metal layer without covering the IGZO semiconducting layer 3 which positioned under the second metal layer according to monitor etching time. It could avoid etching the IGZO semiconducting layer 3 at this time.

Figure 8:
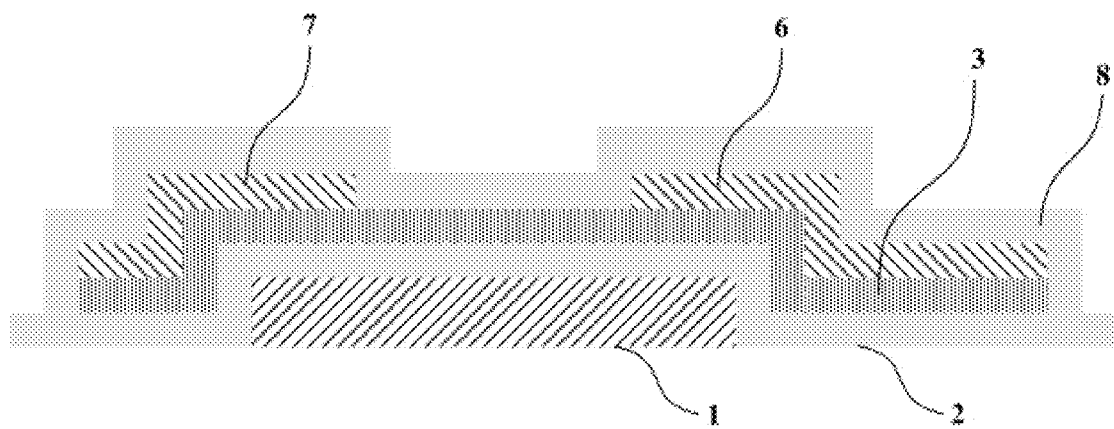
FIG. 8 is a schematic diagram of forming a passivation layer on the source electrode and the drain electrode according to an embodiment of the disclosure.
Figure 9:
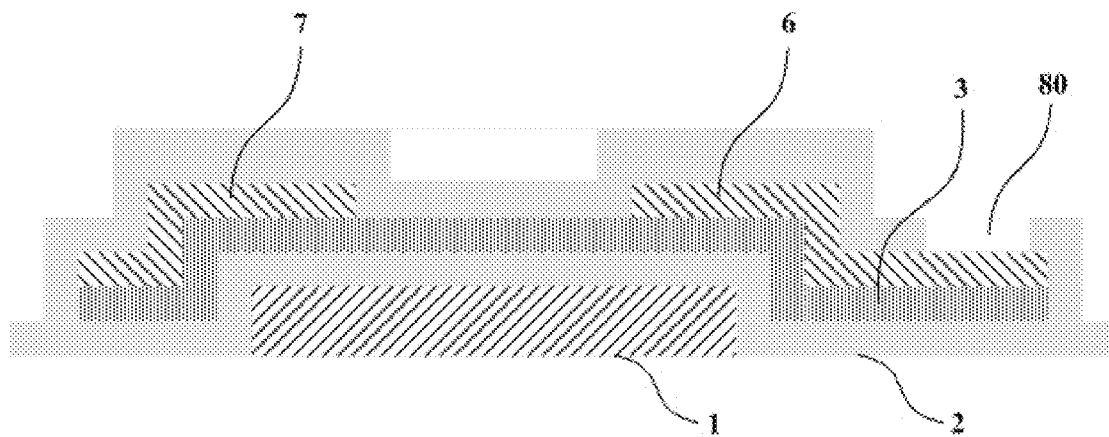
FIG. 9 is a schematic diagram of forming a via hole above the drain electrode according to an embodiment of the disclosure.
Figure 10:
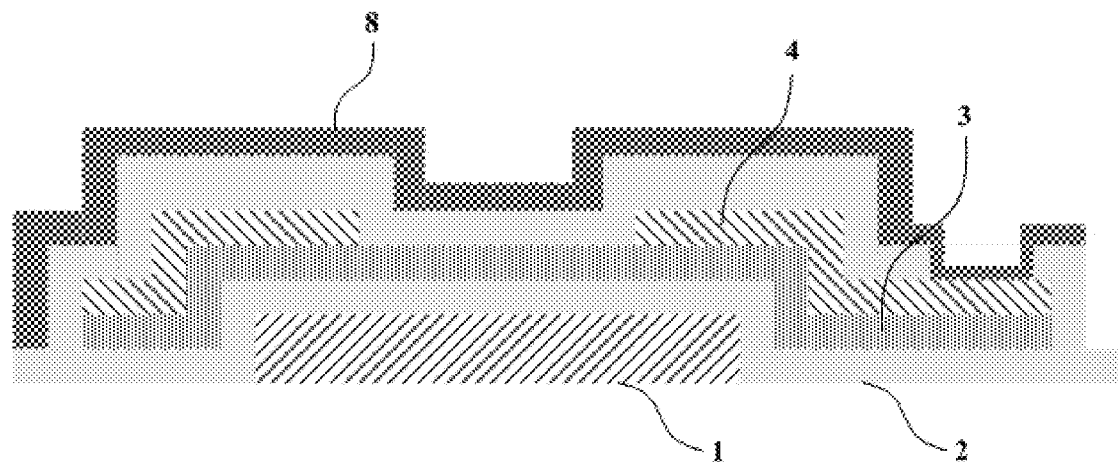
FIG. 10 is a schematic diagram of depositing a pixel electrode layer according to an embodiment of the disclosure.
Figure 11:
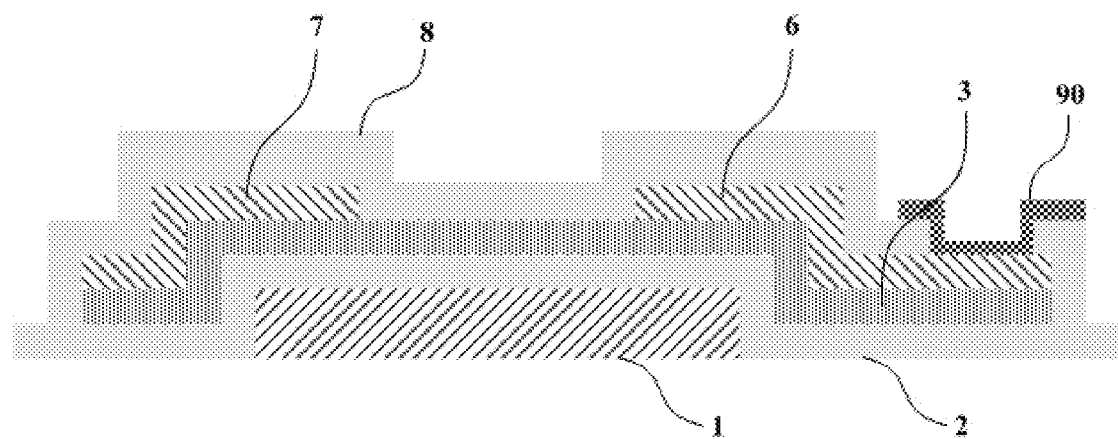
FIG. 11 is a schematic diagram of a pixel electrode is connecting with the drain electrode by the via hole according to an embodiment of the disclosure.

Please refer to FIG. 8, forming a passivation layer 8 on the source electrode 6 and the drain electrode 7 and the IGZO semiconducting layer 3 which is not covered by the source electrode 6 and the drain electrode 7. And please refer to FIG. 9, forming a via hole 80 above the drain electrode 6 by a third mask. The passivation layer 8 could be any one of the silicon dioxide layer, nitrided silicon layer or silicon oxynitride. Please refer to FIG. 10 and FIG. 11, forming a pixel electrode 9 on the passivation layer 8 by deposition. The pixel electrode layer is preferably an ITO layer. Exposure developing the pixel electrode layer 9 by the fourth mask, and forming the pixel electrode 90, and connecting the pixel electrode 90 and the drain electrode 6 by the via hole 80.

In sum. The $H_2O_2$ of this disclosure is used to etching the second metal layer and also etching the IGZO semiconducting layer. The selection ratio of etching speed of the second metal layer and etching speed of the IGZO semiconducting layer is greater than 20 such that the second metal layer and the IGZO semiconducting layer could process the wet etching at the same time. Comparing to the existing technology which needs to respectively process for wet etching, this invention could short the manufacturing time and enhances products yield.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of preparing IGZO thin film transistor, comprising step S1, using a first mask on a first metal layer to form a grid electrode, and sequentially forming a grid insulating layer, a IGZO semiconducting layer and a second metal layer on the grid electrode;

step S2, coating a photoresist layer on the second metal layer, and exposure developing the photoresist layer by a second mask, and simultaneously etching the second metal layer and the IGZO semiconducting layer by hydrogen peroxide, and the second metal layer is formed to a source electrode and a drain electrode by etching;

step S3, forming a passivation layer on the source electrode and the drain electrode, and forming a via hole above the drain electrode by a third mask;

step S4, forming a pixel electrode on the passivation layer by a fourth mask, and the pixel electrode is connecting to the drain electrode by the via hole;

wherein in the step S2 specifically comprising:

coating the photoresist layer on the second metal layer;

exposure developing the photoresist layer by the second mask, removing the photoresist layer projected on the grid electrode and forming a first channel region;

using the hydrogen peroxide to simultaneously etch the second metal layer and the IGZO semiconducting layer located beside the grid electrode;

removing all of the photoresist on the first channel region and forming a second channel region, after using the hydrogen peroxide to simultaneously etch the second metal layer and the IGZO semiconducting layer located beside the grid electrode; and etching the second metal layer in the second channel region to form the drain electrode and the source electrode after removing all of the photoresist on the first channel region, and while etching the second metal layer in the second channel region, the etching of the second metal layer in the second channel region is kept until without covering the IGZO semiconducting layer positioned under the second metal layer by monitoring a time of etching the second metal layer in the second channel region, to thereby avoid etching the IGZO semiconducting layer.

2. The method of preparing IGZO thin film transistor according to claim 1, wherein in the step S2, selection ratio of etching speed of the second metal layer and etching speed of the IGZO semiconducting layer is greater than 20.

3. The method of preparing IGZO thin film transistor according to claim 1, wherein the second mask is half tone mask.

4. The method of preparing IGZO thin film transistor according to claim 1, wherein the photoresist of the first channel region is specifically removed by ashing which performed with oxygen plasma.

5. The method of preparing IGZO thin film transistor according to claim 1, wherein in the step S3, the passivation layer is formed by depositing on the drain electrode, the source electrode and the IGZO semiconducting layer which not covered by the drain electrode and the source electrode.

6. The method of preparing IGZO thin film transistor according to claim 1, wherein in the step S4 specifically comprising forming a pixel electrode layer on the passivation layer exposure developing the pixel electrode layer by the fourth mask, and forming the pixel electrode;

connecting the pixel electrode and the drain electrode by the via hole.

7. The method of preparing IGZO thin film transistor according to claim 1, wherein the pixel electrode layer is ITO layer.

8. The method of preparing IGZO thin film transistor according to claim 1, wherein the IGZO semiconducting layer is forming by physical vapor deposition.

* * * * *